United States Patent [19]

Nagaoka et al.

[11] Patent Number: 5,754,015
[45] Date of Patent: May 19, 1998

[54] HORIZONTAL DEFLECTION CIRCUIT FOR MULTISCAN TYPE DISPLAY DEVICES

[75] Inventors: Shiro Nagaoka; Shigeo Yamashita, both of Tokyo, Japan

[73] Assignee: Pioneer Electronic Corporation, Tokyo, Japan

[21] Appl. No.: 603,973

[22] Filed: Feb. 20, 1996

[30] Foreign Application Priority Data

Feb. 23, 1995 [JP] Japan .................. 7-035677

[51] Int. Cl.$^6$ .................. H01J 29/70
[52] U.S. Cl. .................. 315/411; 315/399
[58] Field of Search .................. 315/367, 387, 315/399, 411; 348/806

[56] References Cited

U.S. PATENT DOCUMENTS 4,673,984  6/1987  Kikuchi et al. .................. 315/411 X
4,679,211  7/1987  Kurz .................. 315/399
5,329,211  7/1994  Sasaki et al. .................. 315/399 X

FOREIGN PATENT DOCUMENTS 61-8628  3/1986  Japan .

*Primary Examiner*—Robert Pascal
*Assistant Examiner*—Justin P. Bettendorf
*Attorney, Agent, or Firm*—Evenson, McKeown, Edwards & Lenahan, PLLC

[57] ABSTRACT

A multiscan compatible horizontal deflection driving circuit prevents the flow of an excessive current through a transistor in a horizontal deflecting circuit when the frequency of a horizontal synchronization signal is switched. In the horizontal deflection driving circuit according to the invention, when a frequency of an H sync pulse of an input composite video signal decreases, a driving power source voltage is reduced earlier than a reduction of a frequency of a horizontal driving pulse, thereby preventing an excessive collector current from flowing in the transistor in the horizontal deflecting circuit.

3 Claims, 4 Drawing Sheets

HORIZONTAL DEFLECTION CIRCUIT FOR MULTISCAN TYPE DISPLAY DEVICES

BACKGROUND OF THE INVENTION

Field of the Invention

The present invention relates to a horizontal deflection driving circuit of a multiscan CRT (cathode ray tube) display device capable of displaying images at a plurality of horizontal scanning frequencies.

DESCRIPTION OF BACKGROUND INFORMATION

In a system presently adopted for television broadcasting, the number of horizontal scanning lines is 525 and the horizontal scanning frequency is equal to 15.75 kHz. On the other hand, there are systems to provide video images for medical treatment, computer display, or the like, in which high definition video images having 1000 or more scanning lines are needed. Conversely, there also are systems in which it is sufficient to display video images having about 300 scanning lines such as an image for monitoring purposes or the like. A CRT display device of a multiscan system which can receive the above mentioned video images having different numbers of scanning lines so that the display is performed by a single device is known. As a prior art multiscan horizontal deflection driving circuit used for the receiver, there is a method in which a DC voltage proportional to a horizontal synchronization signal is generated and an oscillating frequency of a VCO of a horizontal AFC circuit is controlled by the DC voltage, thereby enabling synchronization with frequencies of a plurality of horizontal sync signals in a wide range. This prior art is disclosed in, for example, Japanese Patent Kokoku No. 61-8628.

The prior art will be specifically described hereinbelow with reference to a block diagram of FIG. 1.

A multiscan compatible horizontal deflection driving circuit of FIG. 1 is disclosed in Japanese Patent Kokoku No. 61-8626. In the circuit, a frequency-to-voltage (F/V) converting circuit 1 forms a frequency voltage according to the frequency of a horizontal (H) synchronization pulse extracted from an input composite video signal by a sync signal separating circuit (not shown). A DC converter 2 receives the frequency voltage as an output voltage of the F/V converting circuit 1, forms a driving power source voltage EH according to the frequency voltage, and supplies the voltage EH to a power source terminal of a horizontal deflecting circuit 3. A VCO circuit 4 forms a horizontal driving pulse of a frequency according to the driving power source voltage EH and supplies the horizontal driving pulse to a base of a transistor Q1 in the horizontal deflecting circuit 3. A phase comparator 5 forms a phase voltage according to a phase difference between an input H sync pulse and a pulse voltage which appears in the horizontal deflecting circuit 3 and supplies the phase voltage to the VCO circuit 4. The VCO circuit 4 controls the phase of the horizontal driving pulse in accordance with the phase voltage.

As mentioned above, if for example the number of scanning lines of one frame of the input composite video signal is large, the frequency of the H sync pulse becomes high so that the frequency of the horizontal driving pulse increases and the driving power source voltage EH increases as well.

If, subsequently, a television signal of the NTSC system is input as the input composite signal, since the frequency of the H sync pulse decreases, the frequency of the horizontal driving pulse decreases and the driving power source voltage EH also drops consequently. In this case, if the reduction of the driving power source voltage EH is delayed when the frequency of the horizontal driving pulse is switched so as to be reduced, a collector pulse of the transistor becomes excessively large, so that there is a possibility that a collector current becomes excessive to cause destruction of the transistor Q1.

SUMMARY OF THE INVENTION

The invention has been made to solve the above problems and it is an object of the invention to provide a multiscan compatible horizontal deflection driving circuit for multiscan display devices which prevents the flow of an excessive current through a transistor in a horizontal deflecting circuit when a frequency of a horizontal synchronization signal is switched.

According to the invention, there is provided a multiscan compatible horizontal deflection driving circuit for supplying a driving power source voltage and a horizontal driving pulse to a horizontal deflecting circuit of a CRT, comprising: first control voltage generating means for generating a first control voltage of a magnitude corresponding to a frequency of a horizontal synchronization pulse; driving power source voltage generating means for generating a voltage according to the first control voltage as a driving power source voltage; second control voltage generating means for generating a second control voltage of a magnitude corresponding to the frequency of the horizontal sync pulse; and horizontal driving pulse generating means for generating a pulse of a frequency according to the second control voltage as a horizontal driving pulse, wherein the first control voltage from the first control voltage generating means is generated earlier as compared with the second control voltage from the second control voltage generating means when the frequency of the horizontal sync pulse decreases.

In the multiscan compatible horizontal deflection driving circuit according to the invention, when a frequency of the H sync pulse of an input composite video signal decreases, the driving power source voltage is reduced earlier than the reduction of the frequency of the horizontal driving pulse.

DETAILED DESCRIPTION OF THE PREFERRED EMBODIMENTS

A multiscan compatible horizontal deflection driving circuit according to the invention will be described hereinbelow with reference to the drawings.

Figure 1:
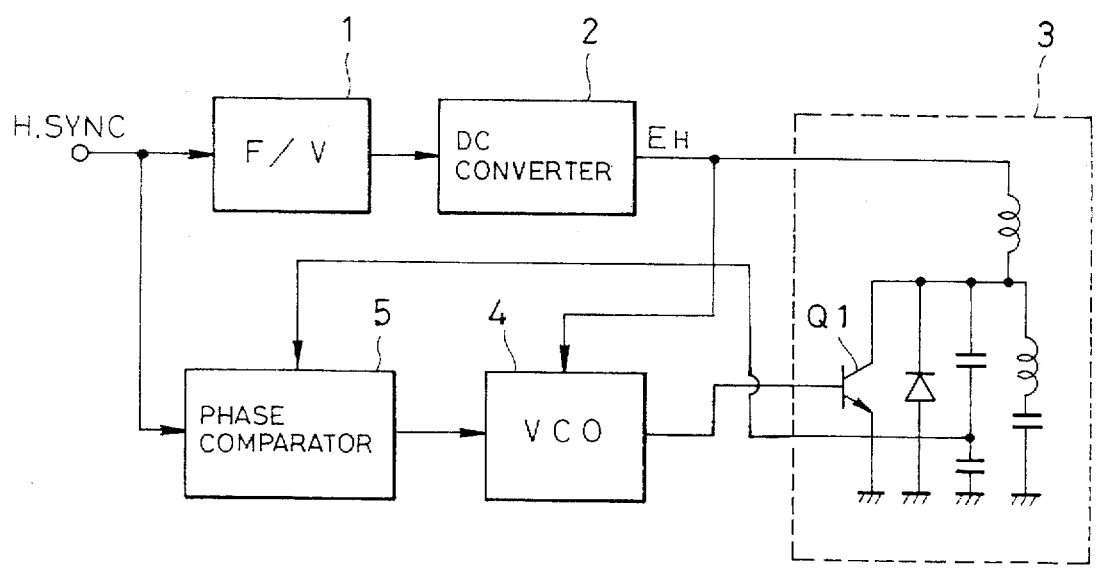
FIG. 1 is a block diagram showing a prior art of a multiscan compatible horizontal deflection driving circuit.
Figure 2:
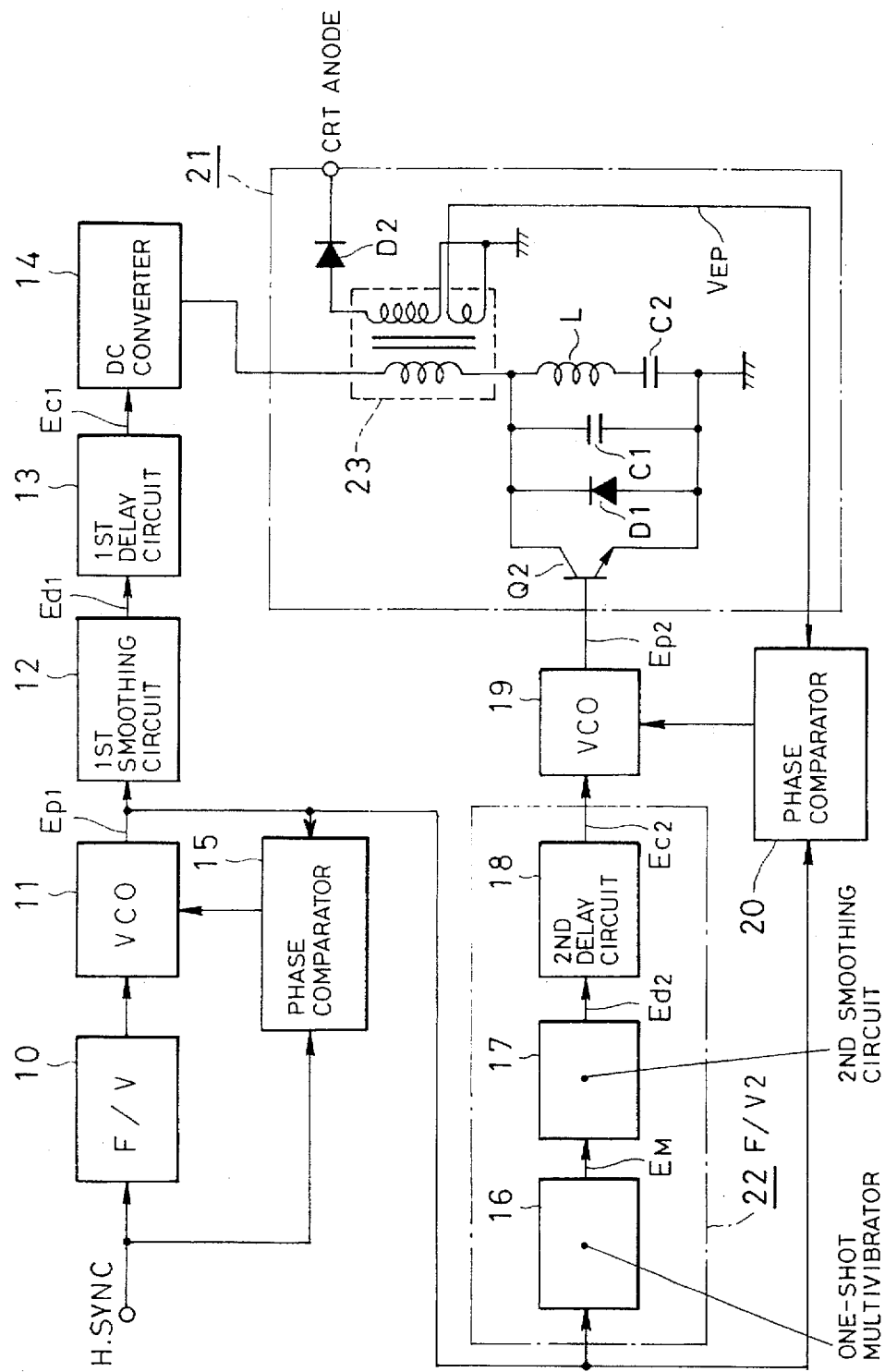
FIG. 2 is a block diagram showing an embodiment of a multiscan compatible horizontal deflection driving circuit according to the invention.

FIG. 2 is a block diagram showing an embodiment of the multiscan compatible horizontal deflection driving circuit according to the invention.

The horizontal deflection driving circuit comprises: an F/V converting circuit 10; VCO circuits 11 and 19; phase comparators 15 and 20; first and second smoothing circuits 12 and 17; first and second delay circuits 13 and 18; a DC converting circuit 14; a one-shot multivibrator circuit 16; and a horizontal deflecting circuit 21.

An operational principle of the circuit will now be described.

When a horizontal synchronization signal is supplied to the F/V converting circuit 10, the F/V converting circuit 10 detects a frequency of the sync signal, forms a DC frequency voltage which is almost proportional to the detected frequency, and supplies the voltage to the VCO circuit 11.

The VCO circuit 11 forms a voltage pulse Ep1 of the same frequency as that of the horizontal sync signal in accordance with the frequency voltage and supplies the pulse Ep1 to the first smoothing circuit 12, phase comparator 15, one-shot multivibrator circuit 16, and phase comparator 20, respectively. The phase comparator 15 detects a phase difference between the voltage pulse Ep1 supplied from the VCO circuit 11 and the horizontal sync signal and supplies a phase difference signal to the VCO circuit 11. The VCO circuit 11, therefore, operates to trace the horizontal sync signal and the phase of the voltage pulse Ep1 is synchronized with that of the horizontal sync signal.

Figure 3:
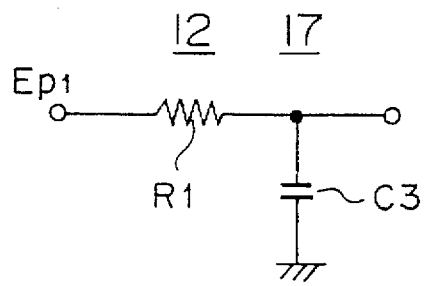
FIG. 3 is a circuit diagram showing a specific example of first and second smoothing circuits shown in FIG. 2.

The first smoothing circuit 12 smoothes the voltage pulse Ep1 supplied from the VCO circuit 11 to produce a DC voltage Ed1, and supplies it to the first delay circuit 13. The first smoothing circuit 12 can be constituted, for example, by an integrating circuit comprising an electric resistor R1 and a capacitor C3 connected between one end of the electric resistor R1 and the ground as shown in FIG. 3.

Figure 4:
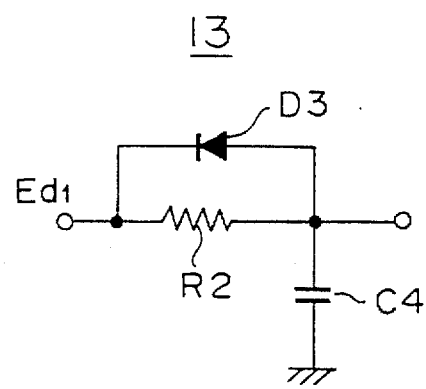
FIG. 4 is a circuit diagram showing a specific example of a first delay circuit shown in FIG. 2.

On the other hand, when the level of the DC voltage supplied thereto increases, the first delay circuit 13 has an integration constant which is larger than a value revealed when the level of the DC voltage decreases. The first delay circuit 13 can be constituted, for example, by an integrating circuit which comprises a resistor R2 and a diode D3 connected in parallel with each other and a capacitor C4 connected between one end of the parallel circuit and the ground as shown in FIG. 4. When the level of the DC voltage Ed1 supplied thereto rises, the diode D3 is turned off and a time constant of the first delay circuit 13 increases (for instance, 700 msec). On the other hand, when the level of the DC voltage Ed1 decreases, the diode D3 is turned on and the time constant of the circuit decreases (for instance, 100 msec).

Figure 6A:
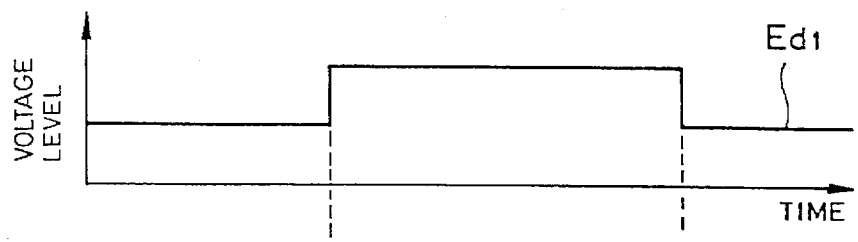
FIGS. 6(A) and 6(B) are waveform diagrams for explaining the operation of the first delay circuit shown in FIG. 2.
Figure 6B:
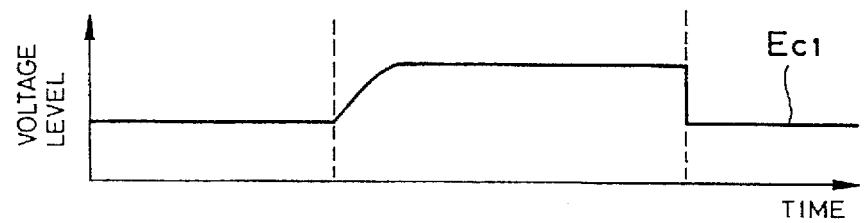

For example, the operation in the case where the DC voltage Ed1 as shown in a portion (A) of FIG. 6 is supplied to the first delay circuit 13 will now be described.

In the portion (A) of FIG. 6, a portion where the voltage level is low shows a portion where the frequency of the horizontal sync signal is low and a portion where the voltage level is high shows a portion where the frequency is high.

The first delay circuit 13 forms the delay voltage Ec1 as shown in a portion (B) of FIG. 6. The first delay circuit 13 delays a level change when the voltage level of the DC voltage Ed1 increases but almost does not delay it when an input voltage level decreases. That is, when the frequency of the horizontal sync signal increases, the increase in the input voltage to the DC converter 14 is delayed. On the other hand, when the frequency decreases, the input voltage to the DC converter 14 is quickly reduced. A delay voltage Ec1 is supplied to the DC converter 14 and the DC converter 14 supplies a driving power source voltage according to the level of the delay voltage Ec1 to one end of a flyback transformer 23 in the horizontal deflecting circuit 21. The driving power source voltage supplied from the DC converter 14 is, therefore, quickly reduced when the frequency of the horizontal sync signal decreases.

On the other hand, the one-shot multivibrator circuit 16 generates a pulse voltage EM having a pulse width larger than that of the voltage pulse Ep1 and the same period as that of the voltage pulse Ep1 by using the voltage pulse Ep1 supplied from the VCO circuit 11 as a trigger signal and supplies the pulse voltage EM to the second smoothing circuit 17.

The second smoothing circuit 17 generates a DC voltage Ed2 by smoothing the pulse voltage EM and supplies the DC voltage Ed2 to the second delay circuit 18. The second smoothing circuit 17 can be constituted, for example, by an integrating circuit as shown in FIG. 3 in a manner similar to the first smoothing circuit 12.

Figure 5:
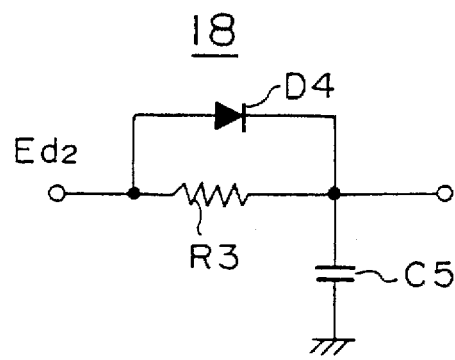
FIG. 5 is a circuit diagram showing a specific example of a second delay circuit shown in FIG. 2.

When the level of the DC voltage supplied thereto decreases, the second delay circuit 18 has an integration constant larger than a value revealed when the level of the DC voltage supplied thereto increases. The second delay circuit 18 can be constituted, for example, by an integrating circuit comprising a resistor R3 and a diode D4 which are connected in parallel and a capacitor C5 connected between one end of the parallel circuit and the ground as shown in FIG. 5. In the delay circuit shown in FIG. 5, when the level of the DC voltage Ed2 supplied thereto rises, the diode D4 is turned on and the time constant of the circuit is reduced (for example, 100 msec). When the level of the DC voltage Ed2 decreases, the diode D4 is turned off and the time constant of the circuit increases (for instance, 700 msec).

Figure 7A:
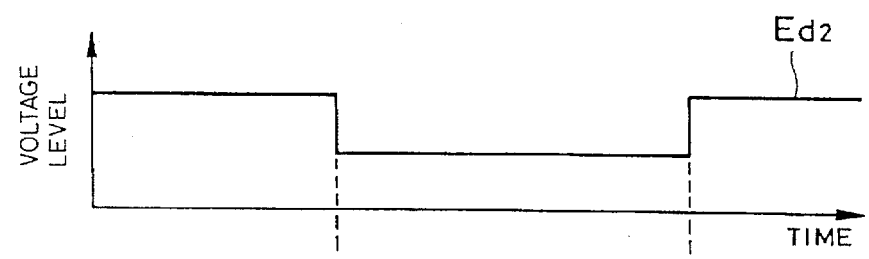
FIGS. 7(A) and 7(B) are waveform diagrams for explaining the operation of the second delay circuit shown in FIG. 2.
Figure 7B:
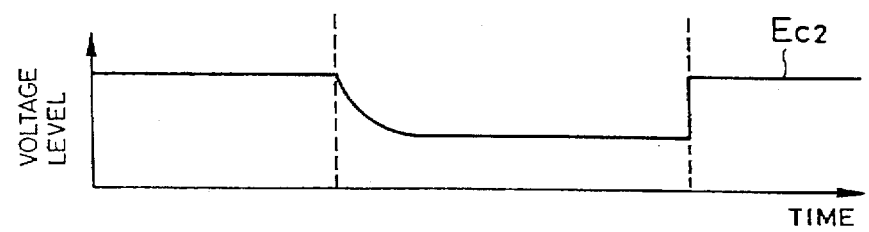

The operation in the case where the DC voltage Ed2 shown in, for example, a portion (A) of FIG. 7 is supplied to the second delay circuit 18 will now be described.

A portion at the low voltage level in the portion (A) of FIG. 7 shows that the frequency of the horizontal sync signal is low. A portion at the high voltage level shows that the frequency is high.

The second delay circuit 18 forms a delay voltage Ec2 shown by a portion (B) of FIG. 7. The second delay circuit 18 gently changes the voltage when the voltage level of the DC voltage Ed2 decreases and quickly raises an output voltage when the voltage level increases. When the frequency of the horizontal sync signal decreases, the change in output voltage is delayed. When the frequency of the horizontal sync signal increases, the change in output voltage is not delayed.

The delay voltage Ec2 is supplied to the VCO circuit 19. The VCO circuit 19 forms a horizontal driving pulse Ep2 according to the level of the delay voltage Ec2 and supplies it to a transistor Q2 in the horizontal deflecting circuit 21. The horizontal driving pulse Ep2, therefore, slowly responds when the frequency of the horizontal sync signal decreases.

In this instance, the voltage pulse Ep1 from the VCO circuit 11 and a flyback pulse signal $V_{EP}$ generated from a detection coil of the flyback transformer 23 are supplied to the phase comparator 20. The phase comparator 20 detects a phase difference between the voltage pulse Ep1 and the flyback pulse $V_{EP}$ and supplies the phase difference signal to the VCO circuit 19. The VCO circuit 19 consequently operates so as to trace the voltage pulse Ep1. The phase of the driving pulse Ep2 is synchronized with the phase of the voltage pulse Ep1, that is, the horizontal sync signal.

The horizontal deflecting circuit 21 will now be described.

In the horizontal deflecting circuit 21, a CRT horizontal deflecting coil (L) and an S-character correction capacitor C2, which are serially connected, a resonance capacitor C1, a damper diode D1, and the transistor Q2 are connected in parallel between the other end of a primary coil of the flyback transformer 23 and the ground. An output of a secondary coil as a high voltage coil of the flyback transformer 23 is rectified by a high voltage diode D2 and is supplied to an anode of the CRT. A detection coil for extracting a flyback pulse and generating the extracted flyback pulse as a flyback pulse signal $V_{FP}$ is also provided for the flyback transformer 23. The flyback pulse signal $V_{FP}$ is supplied to one end of the phase comparator 20 as mentioned above.

The operation of the horizontal deflecting circuit 21 will be further described. First, a power source voltage is supplied to one end of the flyback transformer 23 by the DC converter 14. The driving pulse Ep2 of the VCO circuit 19 is supplied to the transistor Q2. When the transistor Q2 is turned on, electromagnetic energy accumulated in the horizontal deflecting coil (L) is discharged, a current is supplied to the deflecting coil (L), and the current linearly increases. When the transistor Q2 is turned off, the electromagnetic energy accumulated in the deflecting coil (L) flows so as to charge the resonance capacitor C1 and a terminal voltage of the deflecting coil (L) increases. The voltage becomes a horizontal flyback line pulse and is boosted by the flyback transformer 23, and a high voltage is generated in the secondary coil of the transformer 23, is rectified by the high voltage diode D2 and is supplied to the anode of the CRT. When the electromagnetic energy has been charged into the resonance capacitor C1, although no current flows in the deflecting coil (L), an electrostatic energy accumulated in the resonance capacitor C1 is discharged toward the deflecting coil (L) after that. Thus the current flows in the opposite direction in the deflecting coil (L). When the discharge of the resonance capacitor C1 is finished, the energy accumulated in the deflecting coil (L) is discharged via the damper diode D1. The transistor Q2 is again turned on, the above operations are repeated, the high voltage is generated, and a sawtooth wave horizontal deflecting current flows in the deflecting coil (L).

When the frequency of the horizontal sync signal decreases as mentioned above, since the reduction of the frequency of the horizontal driving pulse is delayed more than the reduction of the driving power source voltage supplied to one end of the flyback transformer 23, an excessive collector current flow when the frequency is switched can be prevented.

Since the VCO is provided for generation of each of the driving power source voltage and horizontal driving pulse, even when the frequency of the horizontal sync signal is changed, the phases can be synchronized by quickly tracing the sync signal and a response speed of the scanning at the time of the switching of the frequency can be sufficiently raised.

Although the integrating circuits are used for the first and second delaying means in the described arrangement, the invention is not limited to such an arrangement. It will be understood that, for example, delay circuits having different delay times for the increase and decrease of the input DC voltage can be formed by using a microprocessor.

In short, it is sufficient to set the delay times of the first and second delay circuits so that the reduction of the driving power source voltage supplied to the horizontal deflecting circuit is performed prior to the reduction of the frequency of the horizontal driving pulse.

According to the multiscan compatible horizontal deflection driving circuit of the invention, the reduction of the driving power source voltage supplied to the horizontal deflecting circuit is performed prior to the reduction of the frequency of the horizontal driving pulse when the frequency of the horizontal sync signal decreases, so that the excessive collector current is prevented from flowing in the transistor in the horizontal deflecting circuit.

What is claimed is:

1. A multiscan compatible horizontal deflection driving circuit for supplying a driving power source voltage and a horizontal driving pulse to a horizontal deflecting circuit of a CRT, comprising:

first control voltage generating means for generating a first control voltage of a magnitude corresponding to a frequency of a horizontal synchronization pulse, said first control voltage determining a voltage level of said driving power source voltage;

driving power source voltage generating means for generating the driving power source voltage according to said first control voltage;

second control voltage generating means for generating a second control voltage of a magnitude corresponding to the frequency of said horizontal synchronization pulse, said second control voltage determining a frequency of said horizontal driving pulse; and horizontal driving pulse generating means for generating the horizontal driving pulse of a frequency according to said second control voltage;

wherein the first control voltage from said first control voltage generating means is generated earlier than the second control voltage from said second control voltage generating means when the frequency of the horizontal synchronization pulse decreases.

2. A multiscan compatible horizontal deflection driving circuit for supplying a driving power source voltage and a horizontal driving pulse to a horizontal deflecting circuit of a CRT, comprising:

frequency voltage converting means for generating a frequency voltage of a magnitude corresponding to a frequency of a horizontal synchronization pulse;

means for generating a voltage pulse which corresponds to said frequency voltage and having a phase which is synchronized with that of said horizontal synchronization pulse;

first smoothing means for smoothing said voltage pulse, thereby forming a DC voltage;

first delay means for delaying the DC voltage smoothed by said first smoothing means, thereby forming a first delay voltage;

a converter power source for forming a voltage according to a level of said first delay voltage as a driving power source voltage;

second smoothing means for smoothing said voltage pulse, thereby forming a DC voltage;

second delay means for delaying the DC voltage smoothed by said second smoothing means, thereby forming a second delay voltage; and horizontal driving pulse forming means for forming the horizontal driving pulse which corresponds to said second delay voltage and having a phase which is synchronized with that of said voltage pulse;

wherein said first delay means has a delay time which is shorter than a delay time of said second delay means when a level of an input DC voltage decreases.

3. A circuit according to claim 2, wherein when the level of the input DC voltage decreases, said first delay means has a delay time which is shorter than its delay time when the level of the input DC voltage increases, and when the level of the input DC voltage decreases, said second delay means has a delay time which is longer than its delay time when the level of the input DC voltage increases.

* * * * *